(12) United States Patent
Brown et al.

(10) Patent No.: US 6,841,267 B2
(45) Date of Patent: Jan. 11, 2005

(54) EFFICIENT ELECTROLUMINESCENT DEVICE

(75) Inventors: Christopher T. Brown, Rochester, NY (US); Denis Y. Kondakov, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 33 days.

(21) Appl. No.: 10/131,011

(22) Filed: Apr. 24, 2002

(65) Prior Publication Data

US 2003/0224202 A1 Dec. 4, 2003

(51) Int. Cl.⁷ .............................................. H05B 33/14
(52) U.S. Cl. ...................... 428/690; 428/917; 313/504; 313/506; 257/102
(58) Field of Search ................. 428/690, 917; 313/504, 506; 257/102

(56) References Cited

U.S. PATENT DOCUMENTS 5,150,006 A * 9/1992 Van Slyke et al. .......... 313/504

2002/0127427 A1 * 9/2002 Young et al. ............... 428/690

FOREIGN PATENT DOCUMENTS

| EP | 1 148 109 | 10/2001 |
| JP | 2002-043060 | * 2/2002 |

OTHER PUBLICATIONS

V. Jarikov "Organic Light Emitting Diode Devices with Improved Operational Stability", U.S. Appl. No. 10/131,801, (D–84501) filed Apr. 24, 2002.

D. Y. Kondakov, et al., "Stable Electroluminescent Device", U.S. Appl. No. 10/131,647, (D–84435) filed Apr. 24, 2002.

* cited by examiner

*Primary Examiner*—Dawn Garrett
(74) *Attorney, Agent, or Firm*—Arthur E. Kluegel

(57) ABSTRACT

Disclosed is an OLED device comprising an anode, a hole transporting layer (HTL), a green light emitting layer (LEL), an electron transporting layer (ETL) and a cathode wherein the light emitting layer comprises a host and up to 10 wt % of a green light emitting indeno[1,2,3-cd]perylene dopant compound. Such devices exhibit improved luminance efficiency.

31 Claims, 1 Drawing Sheet

EFFICIENT ELECTROLUMINESCENT DEVICE

CROSS-REFERENCE TO RELATED APPLICATIONS

This application is one of three applications co-filed under U.S. application Ser. Nos. 10/131,647; 10/131,011 and 10/131,801, now abandoned the contents of which are incorporated herein by reference.

FIELD OF THE INVENTION

This invention relates to an organic light emitting diode (OLED) electroluminescent (EL) device comprising a light-emitting layer containing an indeno[1,2,3-cd]perylene compound.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often >100V.

More recent organic EL devices include an organic EL element consisting of extremely thin layers (e.g. <1.0 μm) between the anode and the cathode. Herein, the organic EL element encompasses the layers between the anode and cathode electrodes. Reducing the thickness lowered the resistance of the organic layer and has enabled devices that operate at much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. The interface between the two layers provides an efficient site for the recombination of the injected hole/electron pair and the resultant electroluminescence.

There have also been proposed three-layer organic EL devices that contain an organic light-emitting layer (LEL) between the hole-transporting layer and electron-transporting layer, such as that disclosed by Tang et al [*J. Applied Physics*, Vol. 65, Pages 3610–3616, 1989]. The light-emitting layer commonly consists of a host material doped with a guest material—dopant, which results in an efficiency improvement and allows color tuning.

Since these early inventions, further improvements in device materials have resulted in improved performance in attributes such as color, stability, luminance efficiency and manufacturability, e.g., as disclosed in U.S. Pat. Nos. 5,061,569, 5,409,783, 5,554,450, 5,593,788, 5,683,823, 5,908,581, 5,928,802, 6,020,078, and 6,208,077, amongst others.

Notwithstanding these developments, there are continuing needs for organic EL device components, such as dopants, that will provide high luminance efficiencies combined with high color purity and long lifetimes.

A useful class of dopants is derived from the quinacridone compounds and disclosed in U.S. Pat. No. 5,593,788. These materials are characterized by a broad emission envelope and a high luminance quantum yield. However, the stability of these materials in an OLED is insufficient for a broad range of OLED applications.

Another useful class of dopants is the indenoperylene class of materials as disclosed in EP 1 148 109 A2. These materials are characterized by a "perylene-type" emission spectrum in the green region of the spectrum. It is reported in this work that materials of this class provide unexpected and exceptional device stability when used as a dopant in anthracene and oxinoid hosts as a dopant.

It is a problem to be solved to provide a dopant compound for a light-emitting layer of an OLED device that exhibits improved luminance stability improved luminance efficiency.

SUMMARY OF THE INVENTION

The invention provides an OLED device comprising an anode, a hole transporting layer (HTL), a green light emitting layer (LEL), an electron transporting layer (ETL) and a cathode wherein the light emitting layer comprises a host and up to 10 wt % of a green light emitting indeno[1,2,3-cd]perylene dopant compound.

Devices of the invention provide improved luminance efficiency.

DETAILED DESCRIPTION OF THE INVENTION

Figure 1:
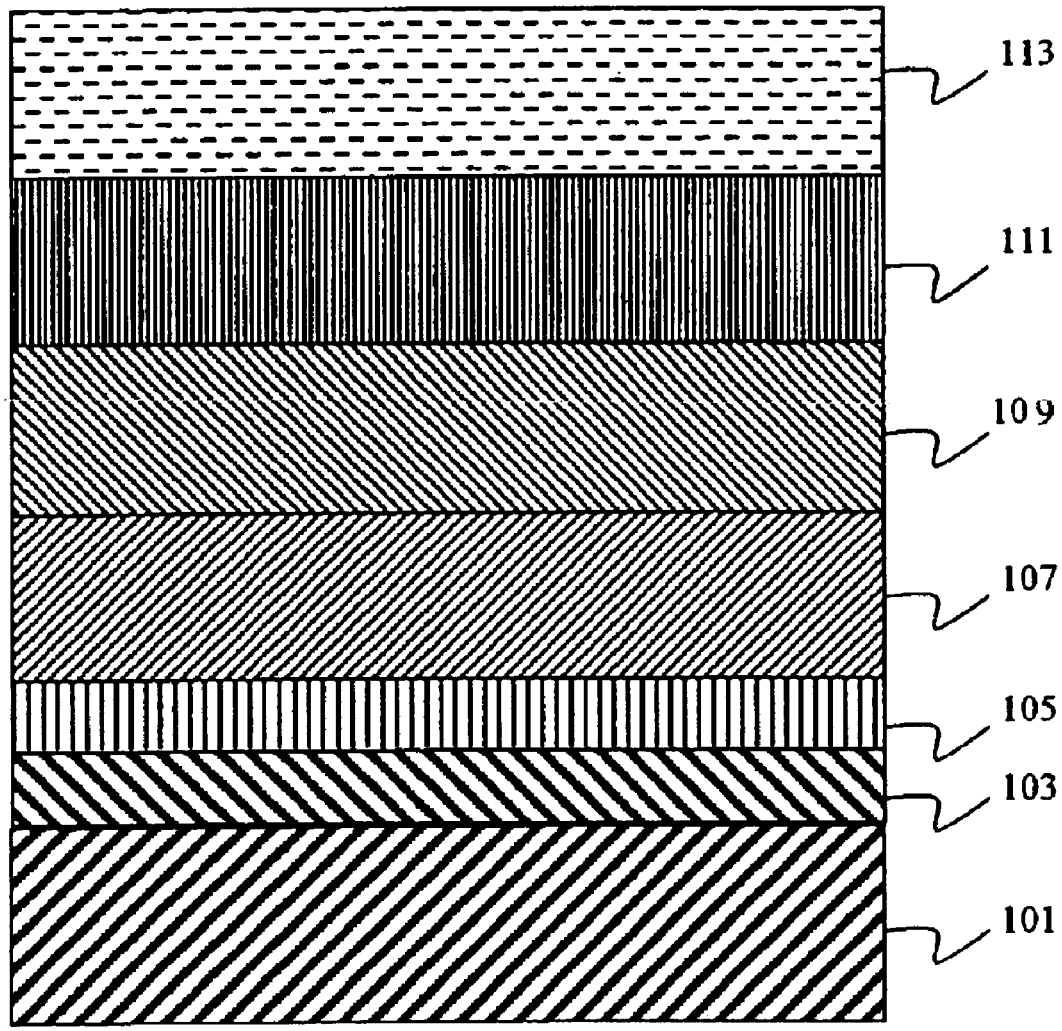
FIG. 1 shows a cross-section of a typical OLED device in which this invention may be used.

The invention is as summarized above.

An OLED device of the invention is a multilayer electroluminescent device comprising a cathode, an anode, charge-injecting layers (if necessary), charge-transporting layers, and a light-emitting layer (LEL) comprising a host and at least one dopant, an indeno[1,2,3-cd]perylene. The term indenoperylene refers to a perylene core with an indene fusion between the 1,2,3 positions of indene and cd faces of perylene. [See *The Naming and Indexing of Chemical Substances for Chemical Abstracts—A Reprint of Index IV (Chemical Substance Index Names) from the Chemical Abstracts*—1992 *Index Guide;* American Chemical Society: Columbus, Ohio, 1992; paragraph 135, 148 and 150. Debad, J. D.; Morris, J. C.; Lynch, V.; Magnus, P.; Bard, A. *J. Am. Chem. Soc.* 1996, 118, 2374–2379]. In this specification, the term indenoperylene is also used to more generally describe materials wherein the fusion between indene's 1,2,3 positions and perylene's cd faces is not limited solely to indene as defined by the above reference. In this case indene can also include analogous materials wherein the benzo-group of indene can be a ring of 5, 6, or 7 atoms comprising carbon or heteroatoms such as nitrogen, sulfur or oxygen.

Suitably, the light-emitting layer of the device comprises a host and an emitting dopant where the dopant is present in an amount of up to 10 wt % of the host, more typically from 0.1–2.0 wt % of the host. The host functions as an initial "energy capture agent" that transfers that energy to the dopant or guest material as the primary light emitter. The host is present in the light emitting layer in an amount of at least 40 wt %.

The benefit imparted by the dopant does not appear to be host specific. Desirable hosts include those based on a chelated oxinoid compound, a benzazole or an anthracene compound although they are not limited to these three classes of host. Particular examples of hosts are tris(8-quinolinolato)aluminum (III), 2,2',2"-(1,3,5-benzenetriyl)tris[1-phenyl-1H-benzimidazole] and 2-tert-butyl-9,10-di-(2-naphthyl)anthracene.

Embodiments of the dopants useful in the invention provide an emitted light having a green hue. Substituents are selected to provide embodiments that exhibit a reduced loss of initial luminance compared to the device containing no indenoperylene of claim 1.

Compounds useful in the invention are suitably represented by Formula (1):

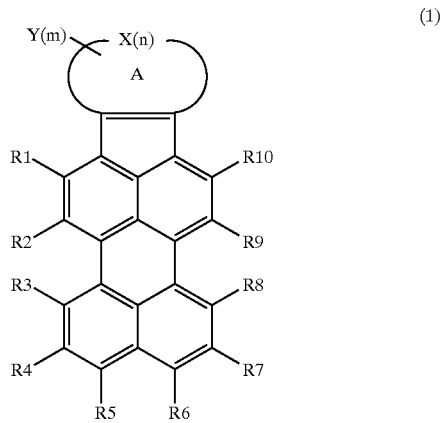

(1)

wherein

A represents an independent ring system in which X represents a chain of a combined total of "n" carbon or heteroatoms which serve to complete a 5, 6 or 7 membered ring;

each Y is an independently selected substituent, two of which may join to form a fused ring to A;

m is 0 to 5; and

R1, R2, R3, R4, R5, R6, R7, R8, R9, and R10 are independently selected as hydrogen or substituents;

provided that any of the indicated substituents may join to form further fused rings.

A useful and convenient embodiment is where R1–R10 are all hydrogen and A is a six membered aromatic hydrocarbon ring and two substituents Y are phenyl groups and two other Ys join to form a fused ring. A related embodiment is when there are no phenyl groups. Another desirable embodiment is where R1–R10 are selected independently from the group consisting of hydrogen, alkyl and aryl. In one useful embodiment, two substituents are selected from R1–10 join to form a fused ring. Another useful embodiment is when the atoms comprising X are independently selected as either carbon and/or a heteroatom and which serves to complete a 5 membered ring.

The emission wavelength of these compounds may be adjusted to some extent by appropriate substitution around the central perylene core. Suitable substitution can desirably provide an emission wavelength in the range of 490–600 nm.

| Compound | Emission Color | Structure |
|---|---|---|
| Inventive | Green | |
| Comparative | Red | |

-continued

| Compound | Emission Color | Structure |
|---|---|---|
| Comparative | Blue | |

The indeno [1,2,3-cd]perylene compound is usually doped into a host compound, which represents the light-emitting layer between the hole-transporting and electron-transporting layers. The host is chosen such that there is efficient energy transfer from the host to the indeno[1,2,3-cd]perylene compound. The indeno[1,2,3-cd]perylene emits from the excited state to afford a bright, highly-efficient, stable EL device.

The EL device of the invention is useful in any device where stable light emission is desired such as a lamp or a component in a static or motion imaging device, such as a television, cell phone, DVD player, or computer monitor.

Illustrative examples of indeno[1,2,3-cd]perylene compounds useful in the present invention are the following:

Inv-1

Inv-2

-continued

Inv-3

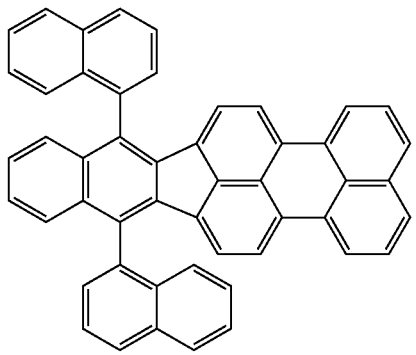

Inv-4

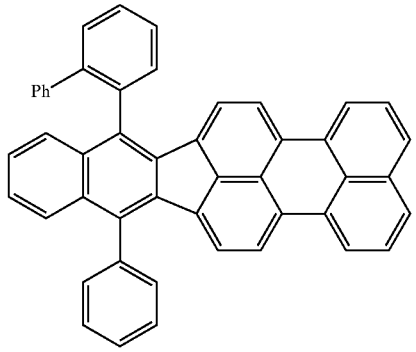

Inv-5

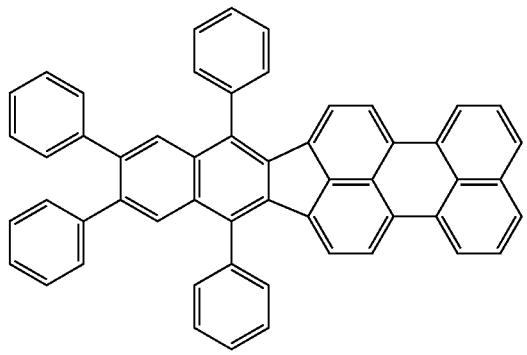

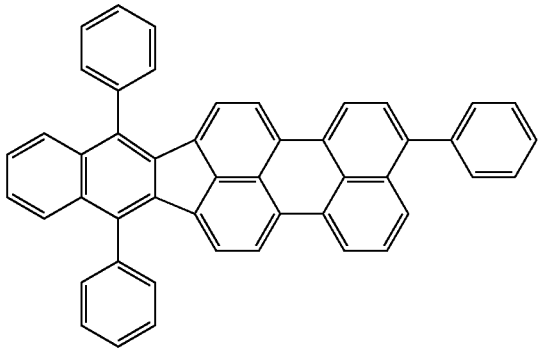

Inv-6
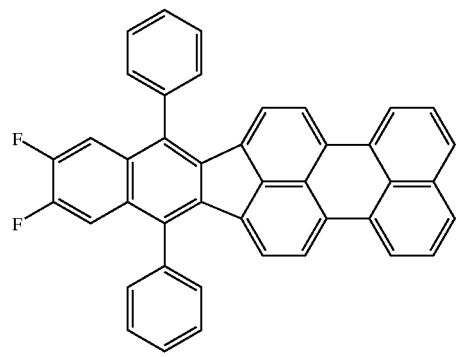
Inv-7
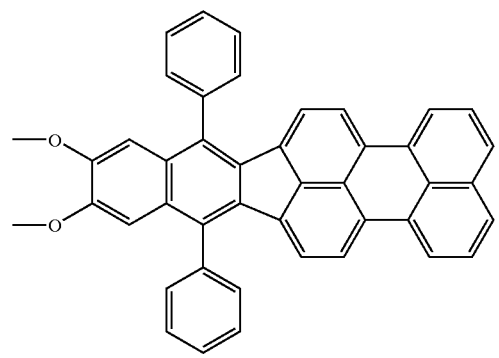
Inv-8
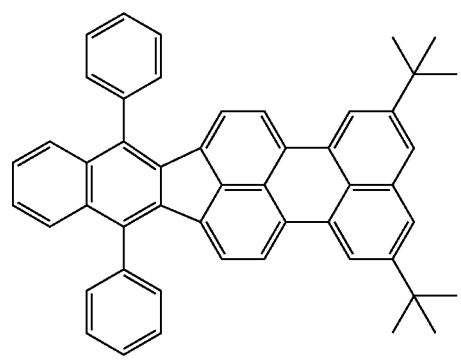
Inv-9
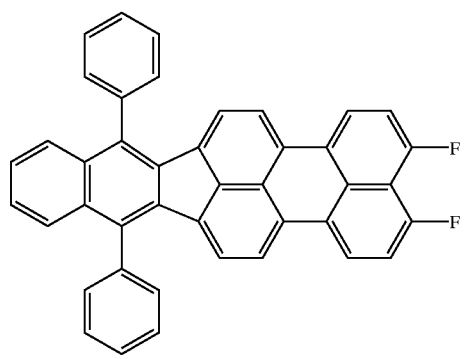
Inv-10
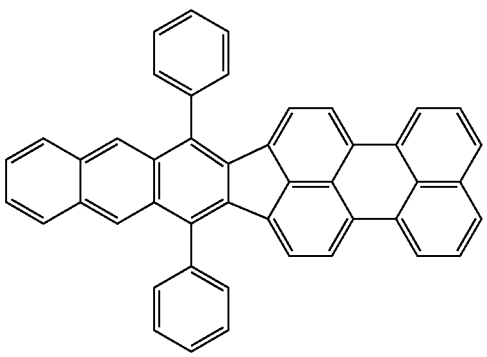
Inv-11
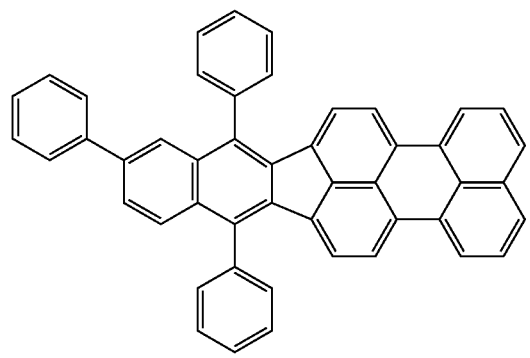
Inv-12
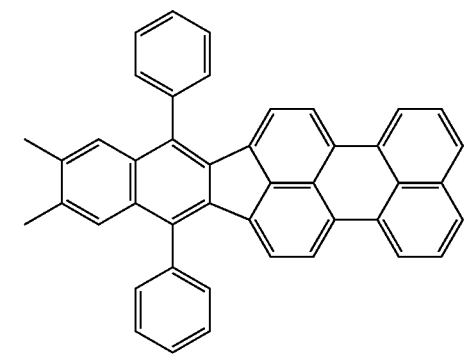
Inv-13
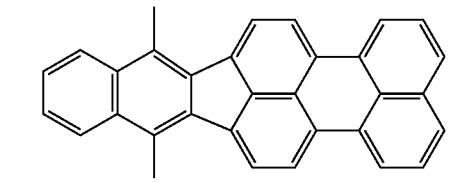
Inv-14
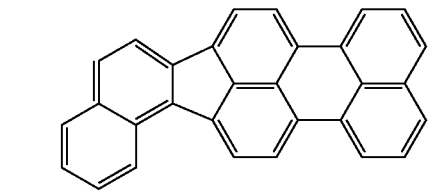
Inv-15
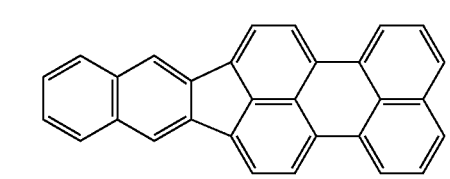

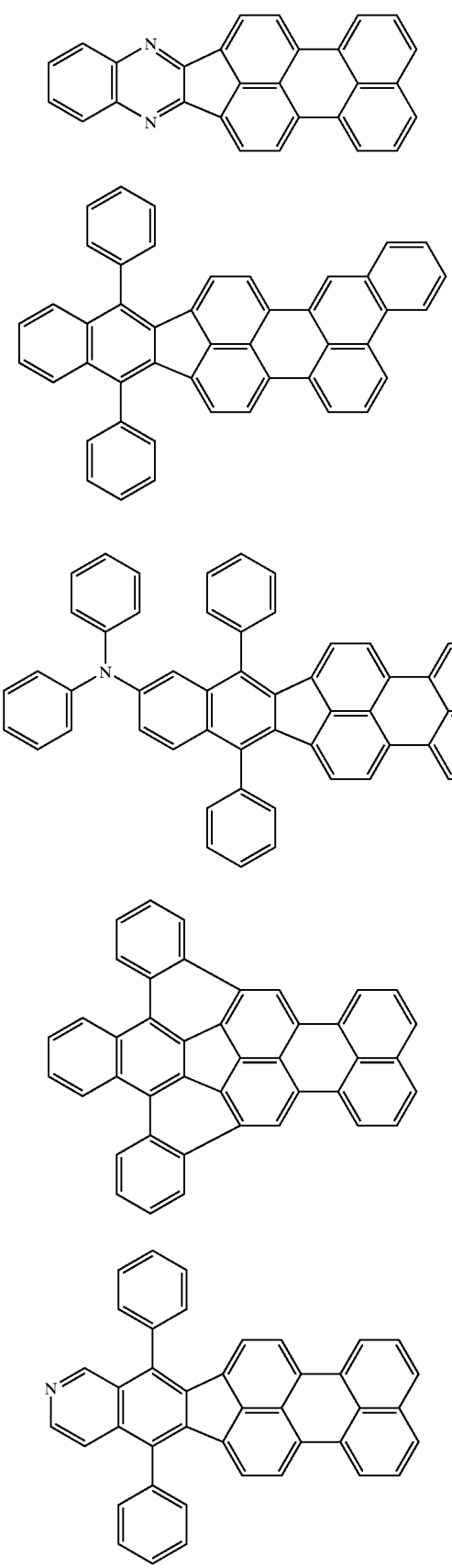
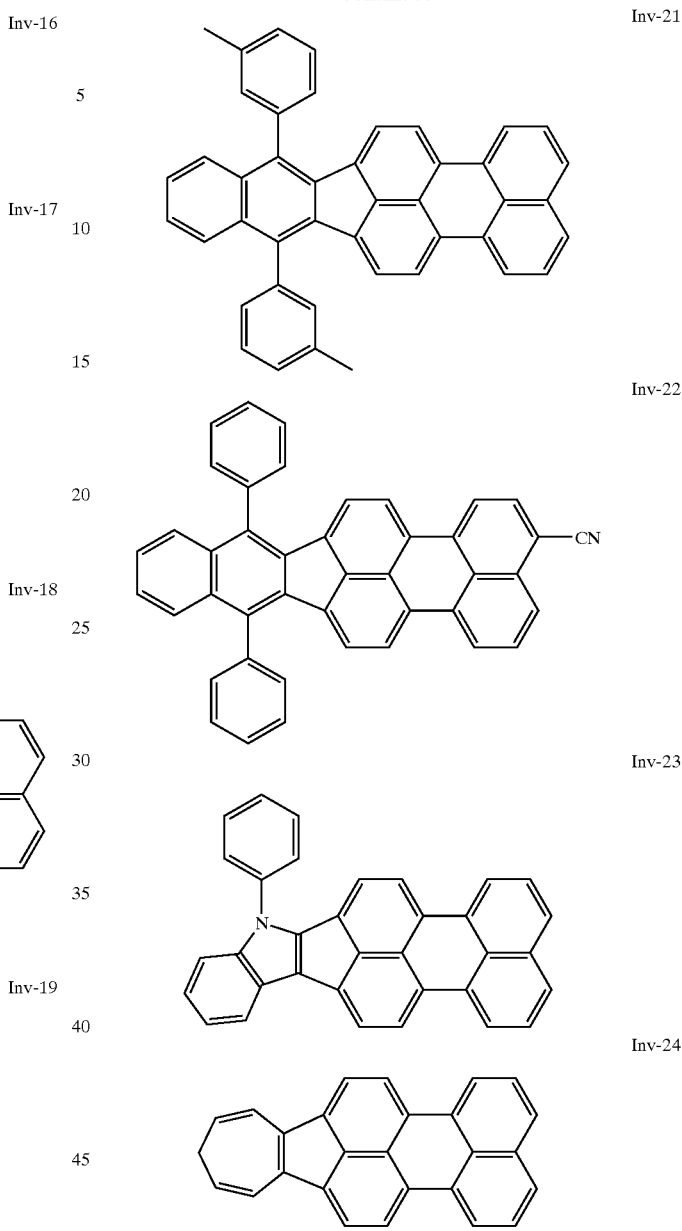

Embodiments of the invention provide not only improved luminance efficiency but also improved stability under load and typically a more desirable green hue.

Unless otherwise specifically stated, use of the term "substituted" or "substituent" means any group or atom other than hydrogen (what about deuterium). Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecy-loxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsul-fonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1(N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. Such as 2-furyl, 2-thienyl, 2-benzimidazolyloxy or 2-benzothiazolyl; quaternary ammonium, such as triethy-lammonium; quaternary phosphonium, such as triph-enylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

There are numerous configurations of the organic layers wherein the present invention can be successfully practiced. Essential requirements are a cathode, an anode, an HTL and an LEL. A more typical structure is shown in FIG. 1 and contains a substrate 101, an anode 103, an optional hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. Also, the total combined thickness of the organic layers is preferably less than 500 nm.

Substrate

The substrate 101 can either be light transmissive or opaque, depending on the intended direction of light emission. The light transmissive property is desirable for viewing the EL emission through the substrate. Transparent glass or organic material are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course it is necessary to provide in these device configurations a light-transparent top electrode.

Anode

The conductive anode layer 103 is commonly formed over the substrate and, when EL emission is viewed through the anode, should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide.

In addition to these oxides, metal nitrides, such as gallium nitride, and metal selenides, such as zinc selenide, and metal sulfides, such as zinc sulfide, can be used in layer 103. For applications where EL emission is viewed through the top electrode, the transmissive characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds such as those described in U.S. Pat. No. 4,720,432, and plasma-deposited fluorocarbon polymers such as those described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine group. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

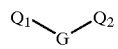

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring group, e.g., a naphthalene. When G is an aryl group, it is conveniently a phenylene, biphenylene, or naphthalene group.

A useful class of triarylamine groups satisfying structural formula (A) and containing two triarylamine groups is represented by structural formula (B):

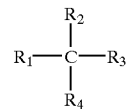

B where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

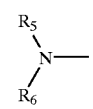

C wherein $R_5$ and $R_6$ are independently selected aryl groups. In one embodiment, at least one of $R_5$ or $R_6$ contains a polycyclic fused ring group, e.g., a naphthalene.

Another class of aromatic tertiary amine groups are the tetraaryldiamines. Desirable tetraaryldiamines groups include two diarylamino groups, such as indicated by formula (C), linked through an arylene group. Useful tetraaryldiamines include those represented by formula (D).

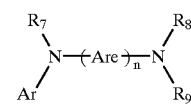

D wherein each Are is an independently selected arylene group, such as a phenylene or anthracene group, n is an integer of from 1 to 4, and Ar, $R_7$, $R_8$, and $R_9$ are independently selected aryl groups. In a typical embodiment, at least one of Ar, $R_7$, $R_8$, and $R_9$ is a polycyclic fused ring group, e.g., a naphthalene.

The various alkyl, alkylene, aryl, and arylene groups of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene groups typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene groups are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorine
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

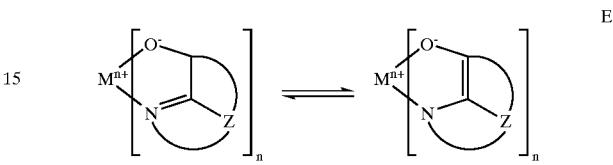

E wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo{f}-8-quinolinolato]zinc (II)

CO-4: Bis(2-methyl-8-quinolinolato)aluminum(III)-μ-oxo-bis(2-methyl-8-quinolinolato)aluminum(III)

CO-5: Indium trisoxine [alias, tris(8-quinolinolato)indium]

CO-6: Aluminum tris(5-methyloxine) [alias, tris(5-methyl-8-quinolinolato)aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

CO-10: Bis(2-methyl-8-quinolinato)-4-phenylphenolatoaluminum (III)

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

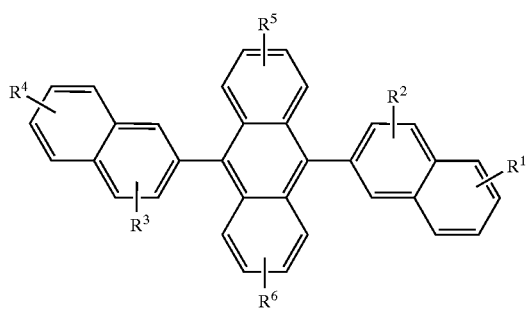

F wherein: $R^1$, $R^2$, $R^3$, $R^4$, $R^5$, and $R^6$ represent hydrogen or one or more substituents selected from the following groups:

Group 1: hydrogen, alkyl and alkoxy groups typically having from 1 to 24 carbon atoms;

Group 2: a ring group, typically having from 6 to 20 carbon atoms;

Group 3: the atoms necessary to complete a carbocyclic fused ring group such as naphthyl, anthracenyl, pyrenyl, and perylenyl groups, typically having from 6 to 30 carbon atoms;

Group 4: the atoms necessary to complete a heterocyclic fused ring group such as furyl, thienyl, pyridyl, and quinolinyl groups, typically having from 5 to 24 carbon atoms;

Group 5: an alkoxylamino, alkylamino, and arylamino group typically having from 1 to 24 carbon atoms; and Group 6: fluorine, chlorine, bromine and cyano radicals.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene, and phenylanthracene derivatives as described in EP 681,019.

Benzazole derivatives (Formula G) constitute another class of useful hosts capable of supporting electroluminescence, and are particularly suitable for light emission of wavelengths longer than 400 nm, e.g., blue, green, yellow, orange or red.

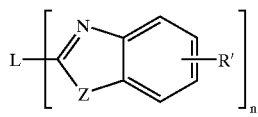

G where:
n is an integer of 3 to 8;
Z is —O, —NR or —S where R is H or a substituent; and
R' represents one or more optional substituents where R and each R' are H or alkyl groups such as propyl, t-butyl, and heptyl groups typically having from 1 to 24 carbon atoms; carbocyclic or heterocyclic ring groups such as phenyl and naphthyl, furyl, thienyl, pyridyl, and quinolinyl groups and atoms necessary to complete a fused aromatic ring group typically having from 5 to 20 carbon atoms; and halo such as chloro, and fluoro;
L is a linkage unit usually comprising an alkyl or ary group which conjugately or unconjugately connects the multiple benzazoles together.

An example of a useful benzazole is 2,2',2"-(1,3,5-phenylene)tris[1-phenyl-1H-benzimidazole], (TPBI).

Distyrylarylene derivatives as described in U.S. Pat. No. 5,121,029 are also useful host materials in the LEL.

Desirable fluorescent dopants include groups derived from fused ring, heterocyclic and other compounds such as anthracene, tetracene, xanthene, perylene, rubrene, coumarin, rhodamine, quinacridone, dicyanomethylenepyran, thiopyran, polymethine, pyrilium thiapyrilium, and carbostyryl compounds. Illustrative examples of useful dopants include, but are not limited to, the following:

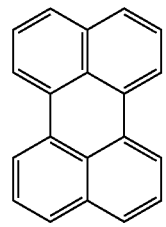

L1

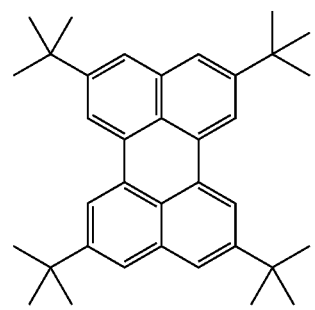

L2

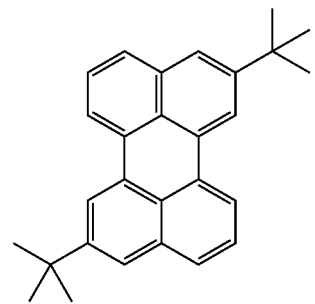

L3

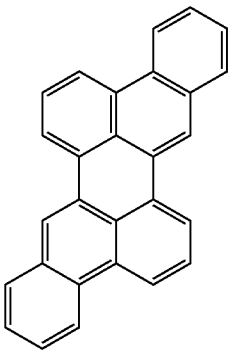

L4

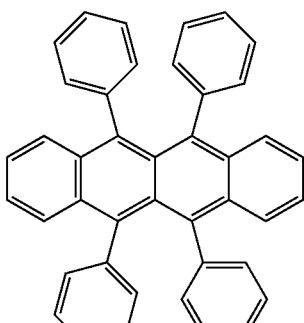

L5

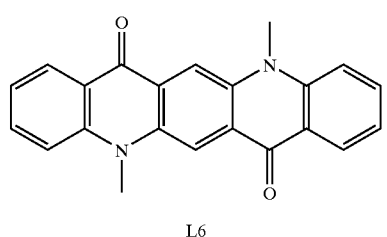

L6

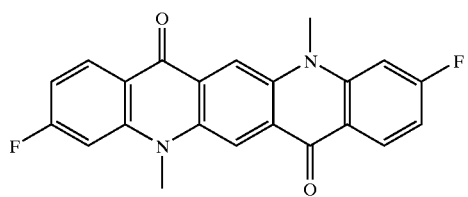

L7

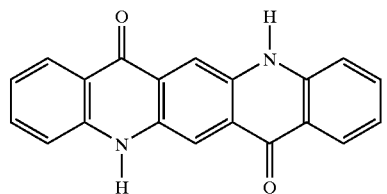

L8

|  | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

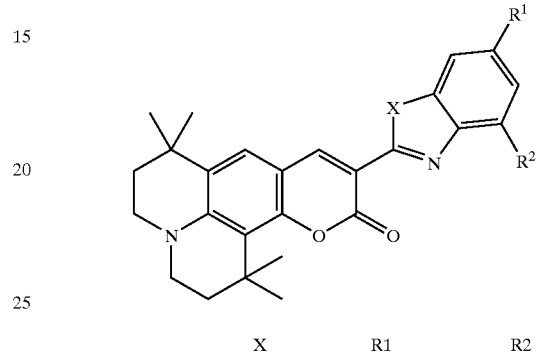

|  | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

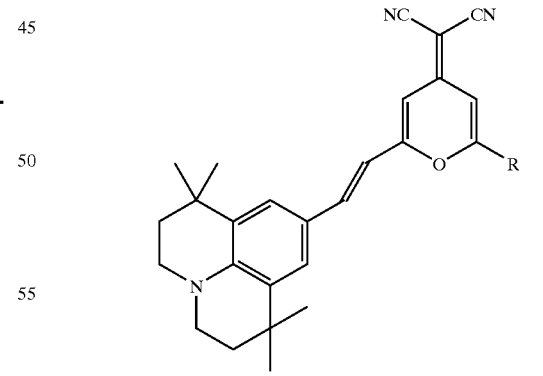

|  | R |
|---|---|
| L37 | phenyl |
| L38 | methyl |
| L39 | t-butyl |
| L40 | mesityl |

-continued

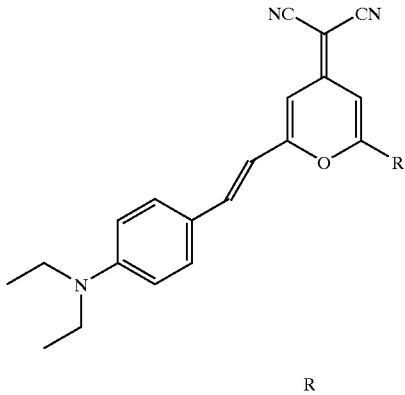

| | R |
|---|---|
| L41 | phenyl |
| L42 | methyl |
| L43 | t-butyl |
| L44 | mesityl |

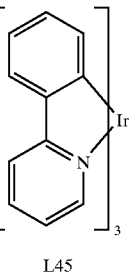

L45

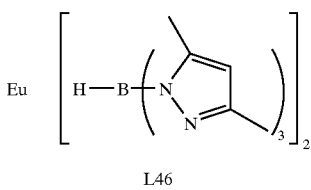

L46

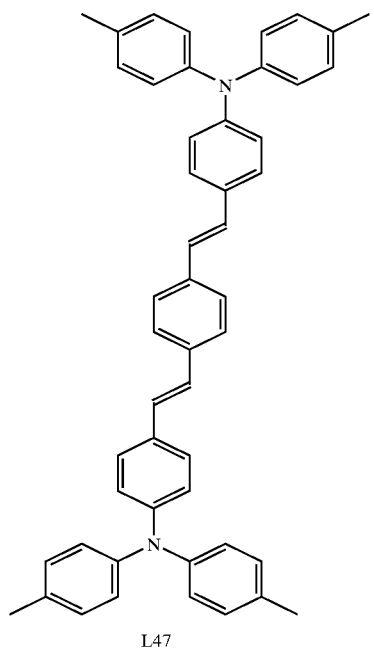

L47

-continued

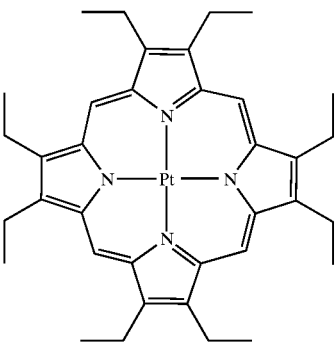

L48

Electron-Transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials.

In some instances, layers 109 and 111 can optionally be collapsed into a single layer that serves the function of supporting both light emission and electron transportation.

Cathode

When light emission is through the anode, the cathode layer 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294, 870), spatially-defined thermal dye transfer from a donor sheet (U.S. Pat. Nos. 5,851,709 and 6,066,357) and inkjet method (U.S. Pat. No. 6,066,357).

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

Hole Blocking Layer

Some OLED devices require a Hole-Blocking Layer to either facilitate injection of electrons into the LEL or attenuate the passage of holes into the ETL to ensure recombination in the LEL (D. F. O'brien, M. A. Baldo, M. E. Thompson, and S. R. Forrest *Appl. Phys. Lett.* 74, 442 (1999)). Typically this layer is thin (i.e.,10 nm) and it is located between the LEL and ETL.

The entire contents of the patents and other publications referred to in this specification are incorporated herein by reference.

EXAMPLES

The inventions and its advantages are further illustrated by the specific examples which follow.

Synthesis

Inv-1

Preparation of 3-(1'-naphthyl)-7,12-diphenylbenzo [k]fluoranthene

To a stirred solution of 3-bromo-7,12-diphenylbenzo[k] fluoranthene (Debad, J. D.; Morris, C. J.; Lynch, V.; Magnus, P.; Bard, A. J. *J. Am. Chem. Soc.* 1996, 118, 2374. Adams, R.; Gold. M. H. *J. Am. Chem. Soc.* 1940, 62, 56. Bergman, E. *J. Am. Chem. Soc.* 1952, 74, 1075) (3 g, 6.2 mmol) and 1-naphthylboronic acid (1.33 g, 7.8 mmol) in ethanol and toluene (100 ml, 1:1) was added 23.4 ml of a 3M solution of sodium carbonate. This mixture was degassed by bubbling with nitrogen for ~15 minutes at which time 358 mg of tetrakis(triphenyl phosphine)palladium (0) was added and the reaction heated at reflux for two hours under a nitrogen blanket. The reaction mixture was cooled to room temperature and the solids collected, washed with warm water and, ethanol and dried in air. These solids were dissolved in dichloromethane (100 ml) and passed through a silica-gel plug (4 inch) and after drying yielded 2.98 g (91% yield) of the desired product.

Results of $^1$H NMR spectroscopy and electrospray mass spectroscopy are consistent with the product. $^1$H NMR δ(300 MHz; CDCl$_3$): 6.56–6.64 (d, 1H), 6.68–6.78 (d, 1H), 7.09–7.77 (m, 22H), 7.84–8.00 (d, 2H). LRMS-ESI m/z (M+1): calcd. 531.7; found 531, 532.

Preparation of Benzo[f-4,7-diphenyl]indeno[1,2,3-cd]perylene(Inv-1)

To a solution of 3-(1'-naphthyl)-7,12-diphenylbenzo[k] fluoranthene in carbon disulfide and under a nitrogen blanket was added (1.58 g, 2.98 mmol) aluminum trichloride (1.67 g, 12.52 mmol) followed by the addition of anhydrous cupric chloride (1.67 g, 12.42 mmol). This mixture was stirred at room temperature overnight and then quenched by the addition of 100 ml of water. The aqueous phase was extracted with 2×100 ml of dichloromethane and dried over magnesium sulfate. This crude material was purified by reverse phase chromatography to yield 0.526 g (33%) of the desired material. $^1$H NMR δ(300 MHz; CDCl$_3$): 6.67–6.67 (d, 2H), 7.37–7.44 (m, 2H), 7.45–7.53 (t, 2H), 7.56–7.75 (d, 4H), 7.65–7.71 (m, 10H) 7.98–8.00 (d, 2H), 8.17–8.19 (d, 2H). LRMS-ESI m/z (M+1): calcd. 529.7; found 529.

Example 1

EL Device Fabrication—Inventive Example

Sample Preparation and Testing

EL devices satisfying the requirements of the invention were constructed as Sample 1–6 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) hole-injecting layer (HIL) by plasma-assisted deposition of CHF$_3$.

b) A hole-transporting layer (HTL) of N,N'-di-1-naphthalenyl-N,N'-diphenyl-4,4'-diaminobiphenyl (NPB) having a thickness of 75 nm was then evaporated from a tantalum boat.

c) A 37.5 nm LEL of tris(8-quinolinolato)aluminum (III) (Alq$_3$) and emitter-dopant, Inv-1, (0–1.25 wt %) were then deposited onto the hole-transporting layer. These materials were also evaporated from tantalum boats.

d) A 10 nm layer of bis(2-Me-8-quinolinolato) (paraphenylphenolato)aluminum(III) (BAlq$_2$) was deposited onto the LEL. This material was also evaporated from a tantalum boat.

e) A 27.5 nm electron-transporting layer (ETL) of tris(8-quinolinolato)aluminum (III) (Alq$_3$) was then deposited onto the light-emitting layer. This material was also evaporated from a tantalum boat.

f) On top of the Alq$_3$ layer was deposited a 220 nm cathode formed of a 10:1 volume ratio of Mg and Ag.

The above sequence completed the deposition of the EL device. The device was then hermetically packaged in a dry glove box for protection against ambient environment.

The cells thus formed were tested for efficiency (in the form of luminance yield), stability and the results are listed in Table 1.

TABLE 1

Evaluation Results for Inv-1 in Alq$_3$.

| Sample | Type | Inv-1 (% wt. %) | Efficiency (cd/A)[1] | L (cd/m$^2$) | T$_{50}$ 70° C. (hr) |
|---|---|---|---|---|---|
| 1 | Comparison | 0 | 3.33 | 665 | 400 |
| 2 | Invention | 0.25 | 7.42 | 1485 | 2250 |
| 3 | Invention | 0.50 | 6.90 | 1381 | 1600 |
| 4 | Invention | 0.75 | 6.21 | 1242 | 1400 |

TABLE 1-continued

Evaluation Results for Inv-1 in Alq$_3$.

| Sample | Type | Inv-1 (% wt. %) | Efficiency (cd/A)[1] | L (cd/m$^2$) | T$_{50}$ 70° C. (hr) |
|---|---|---|---|---|---|
| 5 | Invention | 1 | 5.33 | 1067 | 2150 |
| 6 | Invention | 1.25 | 4.44 | 887 | 2800 |

[1]Luminance yields reported at 20 mA/cm$^2$.

Table 1 summarizes data for use of Inv-1 in an OLED. The "sample" column lists the six devices that were simultaneously prepared. The "type" column describes cells as having used the invention or as a comparison, check, cells. The "Inv-1" column lists the amount of dopant deposited in each cell. The "efficiency" column is a measure of the ability of a given device to convert a charge recombination into light emission as measured in units of candella per ampere (cd/A). The luminance column (L) reflects the light output of a cell (cd/m$^2$) for a given unit of area. Finally, the "T$_{50}$" column lists the time required at elevated temperature for a device to lose 50% luminance while operating at a constant current of 20 mA/cm$^2$.

As can be concluded based on the data in Table 1, all tested EL devices incorporating the Inv-1 dopant demonstrated superior luminance efficiency relative to the comparative device containing only Alq$_3$. These doped EL devices exhibit green electroluminescence with $\lambda_{max}$ ranging from 500–550 nm. In contrast, green emission ($\lambda_{max}$ of 544 nm) attributed exclusively to Alq$_3$ fluorescence is generated in the light-emitting layer of comparative Sample 1.

In addition to the high luminance yields demonstrated by EL devices containing indeno[1,2,3-cd]perylene, the stability of these EL devices also appears to be dramatically increased over that of a device without said material. Specifically, Samples 2 and 6 containing Inv-1 in Alq$_3$ provide a 463% and 600% improvement in luminance stability versus comparative Sample 1.

Lifetime Measurement-T50

Device Sample 1, Table 1, was tested for lifetime at 70° C., operating at an average current density of 20 mA/cm$^2$ (0.5 ms forward bias at 40 mA/cm$^2$ alternating with the 0.5 ms of reverse bias of −14V). A plot of luminance vs. time was fitted with stretched exponential function of the following form:

$L_t = L_0 \exp(A\ t^B)$, where $L_t$ is luminance at time t, $L_0$ is initial luminance, A and B are empirical fit parameters, found to be −0.00969 and 0.59, respectively. The half-life of the device was found by calculating time at which $L_t/L_0 = 0.5$. Samples 2–6 were treated in a similar fashion to obtain extrapolated half-lives and are listed in Table 1.

Example 2
EL Device Fabrication—Inventive Example

EL devices satisfying the requirements of the invention were constructed as Samples 7–11 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) HIL by plasma-assisted deposition of CHF$_3$.

b) A HTL of N,N'-di-1-naphthalenyl-N,N'-diphenyl-4,4'-diaminobiphenyl (NPB) having a thickness of 75 nm was then evaporated from a tantalum boat.

c) A 37.5 nm light-emitting layer (LEL) of 2-tert-butyl-9,10-di-(2-naphthyl)anthracene (TBADN) and Inv-1 (0–2.5% wt %) were then deposited onto the hole-transporting layer. These materials were also evaporated from tantalum boats.

d) A 37.5 nm ETL of tris(8-quinolinolato)aluminum (III) (Alq$_3$) was then deposited onto the light-emitting layer. This material was also evaporated from a tantalum boat.

e) On top of the Alq$_3$ layer was deposited a 220 nm cathode formed of a 10:1 volume ratio of Mg and Ag.

The above sequence completed the deposition of the EL device. The device was then hermetically packaged in a dry glove box for protection against ambient environment.

The cells thus formed were tested for efficiency (in the form of luminance yield), stability as described for Table 1, and the results are listed in Table 2.

TABLE 2

Evaluation Results for Inv-1 in TBADN.

| Sample | Type | Inv-1 (% wt. %) | Efficiency (cd/A)[1] | L (cd/m$^2$) | T$_{50}$ 70° C. (hr) |
|---|---|---|---|---|---|
| 7 | Invention | 0.50 | 5.26 | 1053 | 2650 |
| 8 | Invention | 1.00 | 3.80 | 759 | 3150 |
| 9 | Invention | 1.50 | 2.93 | 586 | 2000 |
| 10 | Invention | 2.00 | 2.77 | 554 | 1850 |
| 11 | Invention | 2.5 | 2.55 | 509 | 2025 |
| 12 | Comparison | 0 | 1.92 | 384 | 270 |

[1]Luminance yields reported at 20 mA/cm$^2$.

The tested EL device incorporating the Inv-1 dopant in a TBADN host demonstrates a superior luminance yield relative to the comparative device. The inventive device exhibited green emission ($\lambda_{max}$ of 544 nm) with a well-defined vibronic structure and narrow emission peaks as opposed to the very blue TBADN emission at 448 nm.

In addition to the high luminance yields demonstrated by EL devices containing indeno[1,2,3-cd]perylene, the stability of these EL devices also appears to be dramatically increased over that of a device without said material. Specifically, Samples 7 and 8 containing Inv-1 in TBADN provide an 882% and 1067% improvement in luminance stability versus the comparative T50 of Sample 12.

Example 3
EL Device Fabrication—Inventive Example

EL devices satisfying the requirements of the invention were constructed as Samples 13–18 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) HIL by plasma-assisted deposition of CHF$_3$.

b) A HTL of N,N'-di-1-naphthalenyl-N,N'-diphenyl-4,4'-diaminobiphenyl (NPB) having a thickness of 75 nm was then evaporated from a tantalum boat.

c) A 37.5 nm light-emitting layer (LEL) of 2-tert-butyl-9,10-di-(2-naphthyl)anthracene (TBADN) and Inv-1 (0–1.25% wt %) were then deposited onto the hole-transporting layer. These materials were also evaporated from tantalum boats.

d) A 10 nm layer of bis(2-Me-8-quinolinolato) (paraphenylphenolato)aluminum(III) (BAlq$_2$) was deposited onto the LEL. This material was also evaporated from a tantalum boat.

d) A 27.5 nm ETL of tris(8-quinolinolato)aluminum(III) (Alq$_3$) was then deposited onto the light-emitting layer. This material was also evaporated from a tantalum boat.

e) On top of the Alq$_3$ layer was deposited a 220 nm cathode formed of a 10:1 volume ratio of Mg and Ag.

The above sequence completed the deposition of the EL device. The device was then hermetically packaged in a dry glove box for protection against ambient environment.

The cells thus formed were tested for efficiency (in the form of luminance yield) and stability as above and the results are listed in Table 3.

TABLE 3

Evaluation Results for Inv-1 in TBADN.

| Sample | Type | Inv-1 (% wt. %) | Efficiency (cd/A)[1] | L (cd/m$^2$) | T$_{50}$ 70° C. (hr) |
|---|---|---|---|---|---|
| 13 | Comparison | 0 | 0.96 | 192 | 220 |
| 14 | Invention | 0.25 | 5.26 | 1052 | 2100 |
| 15 | Invention | 0.50 | 5.06 | 1012 | 2875 |
| 16 | Invention | 0.75 | 4.73 | 946 | 5400 |
| 17 | Invention | 1.00 | 3.79 | 758 | 5650 |
| 18 | Invention | 1.25 | 3.42 | 685 | 5200 |

[1]Luminance yields reported at 20 mA/cm$^2$.

Note that the values shown in this table differ significantly form the values in Table 2 due to the presence of a Hole Blocking layer.

The tested EL device incorporating the Inv-1 dopant in a TBADN host demonstrates a superior luminance yield relative to the comparative device. The inventive device exhibited green emission ($\lambda_{max}$ of 540 nm) with a well-defined vibronic structure and narrow emission peaks as opposed to the very blue TBADN emission at 452 nm.

In addition to the high luminance yields demonstrated by EL devices containing indeno[1,2,3-cd]perylene, the stability of these EL devices also appears to be dramatically increased over that of a device without said material. Specifically, a minimum improvement of 855% was observed for Sample 14 containing Inv-1 in TBADN relative to an undoped LEL, Sample 13. Additionally, samples 16, 17 and 18, each of which comprises differing concentrations of Inv-1 in TBADN, yielded remarkable improvements in luminance stability of 2355%, 2468% and 2263%, respectively.

EL data for the quinacridone green dopants, presented in U.S. Pat. No. 5,593,788 is not directly comparable with the EL data obtained above. Such compounds are exemplified by the following:

Comp-1

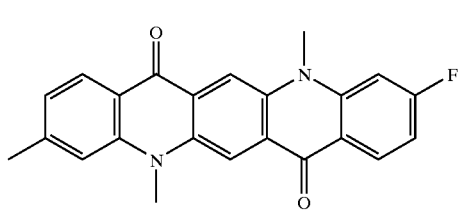

The reported luminance yields for Comp-1 are similar to those of the inventive examples tested. However, in general the quinacridone green dopants exhibit a decreased operational stability relative to inventive examples. A typical device is detailed in Table 4 wherein Comp-1 (3,10-difluoro-5,12-dimethyl-7,14-dione-quino[2,3-b]acridine) is employed as a typical illustration of quinacridone-green-dopant performance.

Half-life determinations were made in a manner identical to that used for Example 1. Results of these extrapolations are detailed in Table 4.

TABLE 4

Evaluation Results for Comp-1 in Alq$_3$.

| Sample | Type | Comp-1 (% wt. %) | Efficiency (cd/A)[1] | L (cd/m$^2$) | T$_{50}$ 70° C. (hr) |
|---|---|---|---|---|---|
| 19 | Comparison | 0 | 2.57 | 514 | 550 |
| 20 | Comp-1 | 0.25 | 5.88 | 1175 | 520 |
| 21 | Comp-1 | 0.50 | 6.52 | 1304 | 430 |
| 22 | Comp-1 | 1.00 | 5.46 | 1093 | 285 |
| 23 | Comp-1 | 2.00 | 3.55 | 710 | 220 |
| 24 | Comp-1 | 3.00 | 3.20 | 641 | 140 |

[1]Luminance yields reported at 20 mA/cm$^2$.

The stability (T$_{50}$) of devices containing Comp-1, Samples 19–24, decreased steadily as the wt % of Comp-1 increased from 0.25% wt % to 3% wt %. These results stand in stark contrast to most of the Inv-1 data reported in Tables 1 and 2. However, the behavior of Inv-1 reported in Table 3 is markedly better than that shown for Comp-1. In fact, based on the data in Table 3, the improvement Inv-1 provides relative to Comp-1 is a minimum of 300% and a maximum of 1900%.

PARTS LIST

101 Substrate
103 Anode
105 Hole-Injecting layer (HIL)
107 Hole-Transporting layer (HTL)
109 Light-Emitting layer (LEL)
111 Electron-Transporting layer (ETL)
113 Cathode

What is claimed is:

1. An OLED device comprising an anode, a hole transporting layer (HTL), a green light emitting layer (LEL), an electron transporting layer (ETL) and a cathode wherein the light emitting layer comprises a host and up to 10 wt % of a green light emitting indeno[1,2,3-cd]perylene dopant compound and wherein a hole blocking layer is located between the LEL and ETL.

2. The device of claim 1 wherein the light emitting layer comprises up to 5 wt % of the indenoperylene compound.

3. The device of claim 1 wherein the light emitting layer comprises from 0.1 to 2.0 wt % of the indenoperylene compound.

4. The device of claim 1 wherein the host comprises a chelated oxinoid compound.

5. The device of claim 1 wherein the host comprises a benzazole compound.

6. The device of claim 1 wherein the host comprises an anthracene compound.

7. The device of claim 1 wherein the host contains a member selected from the group consisting of one or more members of the group Alq$_3$, TPBI and TBADN.

8. The device of claim 1 wherein the host comprises Alq$_3$.

9. The device of claim 1 wherein the host comprises TBADN.

10. The device of claim 1 wherein the host comprises Alq₃ and TBADN.

11. The device of claim 9 wherein the TBADN has the formula:

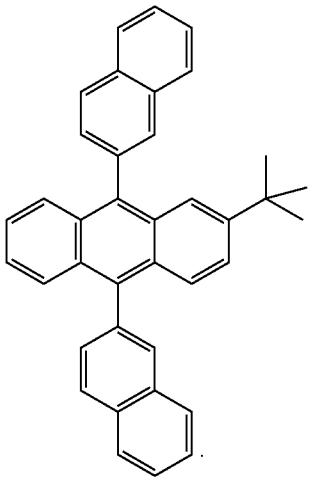

12. The device of claim 8 wherein the host (Alq₃) has the formula:

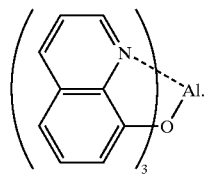

13. The device of claim 1 wherein the host is present in the light emitting layer in an amount of at least 40 wt %.

14. The device of claim 1 wherein the indeno[1,2,3-cd] perylene compound is represented by Formula (1):

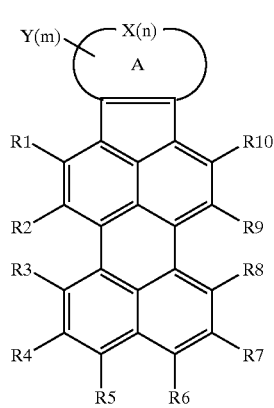

wherein:
A represents an independent ring system in which X represents a chain of a combined total of "n" carbon or heteroatoms which serve to complete a 5, 6 or 7 membered ring;
each Y is an independently selected substituent, two of which may join to form a fused ring to A;

m is 0 to 5; and

R1, R2, R3, R4, R5, R6, R7, R8, R9, and R10 are independently selected as hydrogen or substituents;

provided that any of the indicated substituents may join to form further fused rings.

15. The device of claim 14 wherein at least one of the aryl groups shown is further substituted.

16. The device of claim 1 wherein the host comprises two materials.

17. The device of claim 14 wherein the substituents and the ring size of A are selected so as to provide luminescence stability improvements for aged devices.

18. The device of claim 1 wherein the substituents of the indenoperylene are selected to provide improved luminescence efficiency compared to the device with no indenoperylene dopant.

19. The device of claim 14 wherein ring A contains two Y substituents joined to form a fused ring.

20. The device of claim 14 wherein ring A contains Y substituents joined to form more than one fused ring.

21. The device of claim 14 wherein at least one of Y is independently selected from the group consisting of halide, alkyl, aryl, alkoxy, and aryloxy.

22. The device of claim 14 wherein R1–10 are hydrogen.

23. The device of claim 14 wherein two of R1, R2, R3, R4, R5, R6, R7, R8, R9, and R10 join to form a fused ring.

24. The device of claim 14 wherein at least one of R1, R2, R3, R4, R5, R6, R7, R8, R9, and R10 are independently selected from the group consisting of halide, alkyl, aryl, alkoxy and aryloxy groups.

25. The device of claim 14 wherein one of R1, R2, R3, R4, R5, R6, R7, R8, R9, and R10 are independently selected to join with a group Y to form one or more fused rings.

26. The device of claim 14 wherein the emissive dopant luminesces with a $\lambda_{max}$ in the region of 490–600 nm.

27. The device of claim 1 wherein the indenoperylene compound is represented by one of the following formulas.

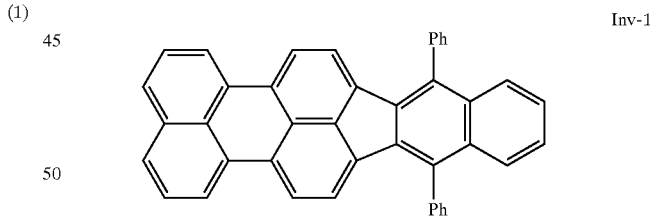

Inv-1

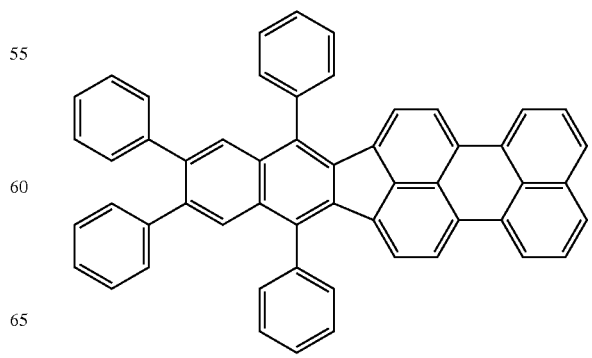

Inv-2

-continued
Inv-3
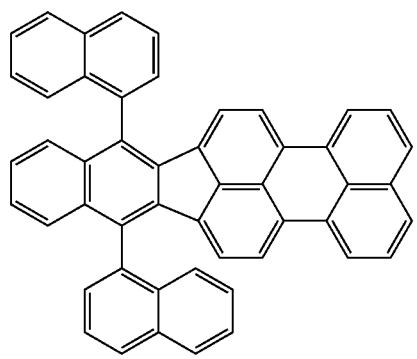
Inv-4
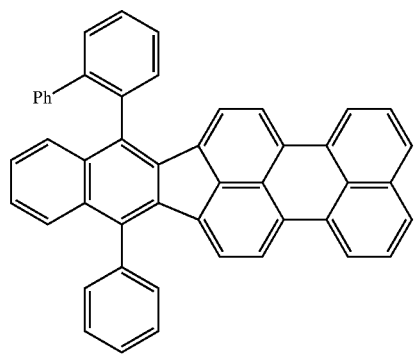
Inv-5
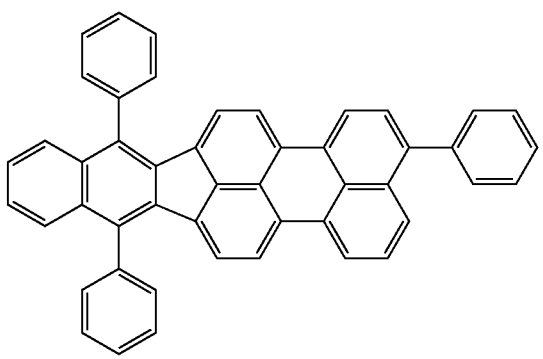
Inv-6
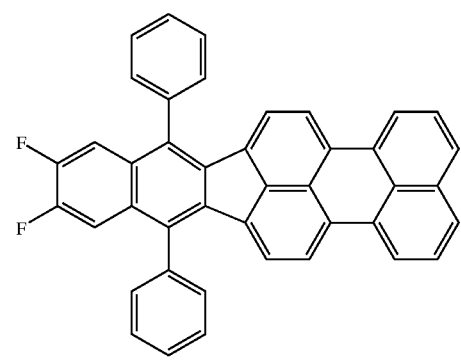
-continued
Inv-7
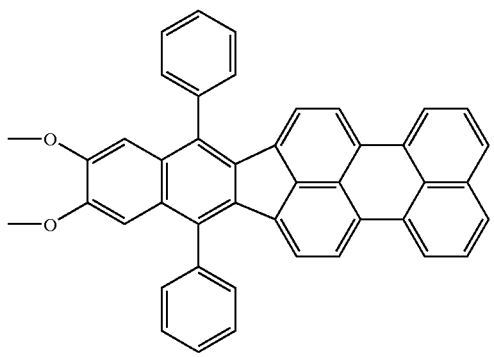
Inv-8
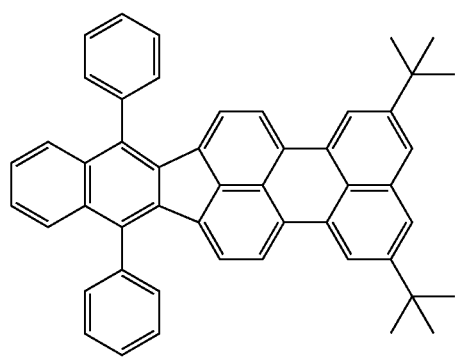
Inv-9
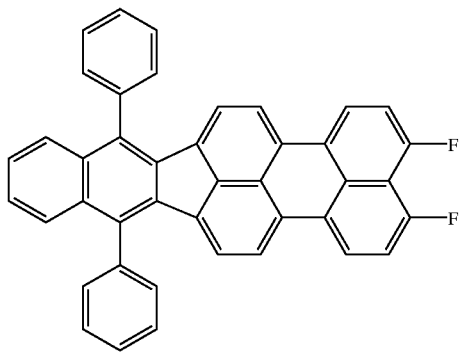
Inv-10
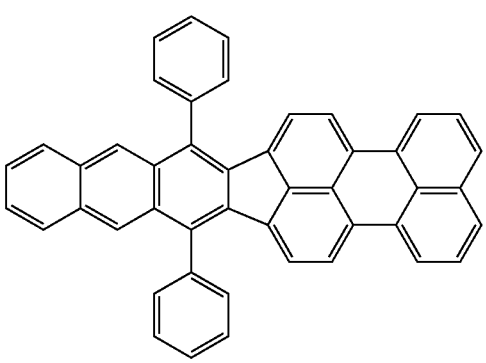

Inv-11
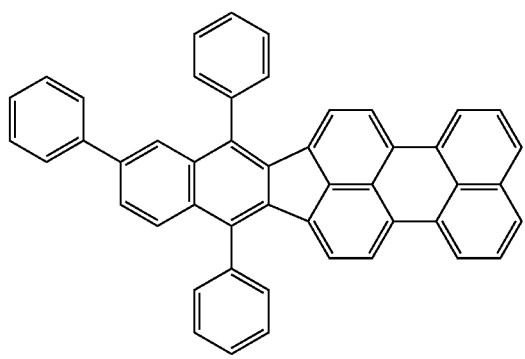
Inv-12
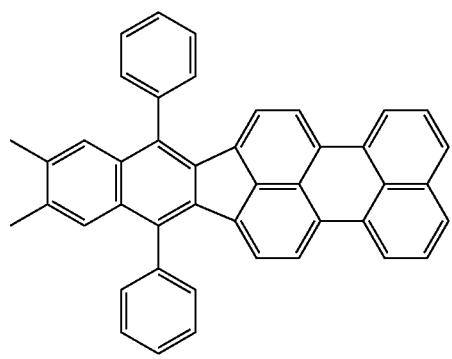
Inv-13
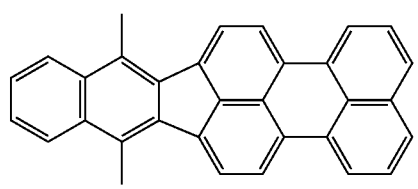
Inv-14
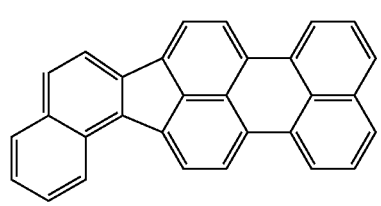
Inv-15
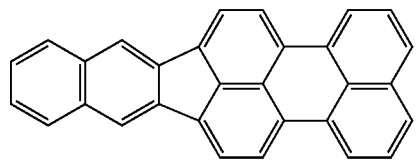
Inv-16
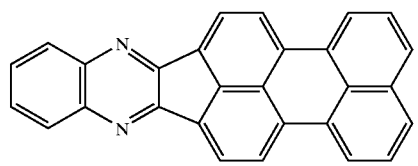
Inv-17
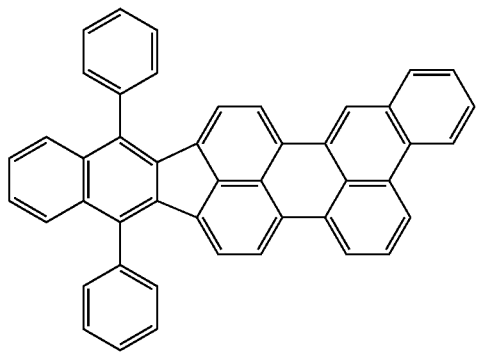
Inv-18
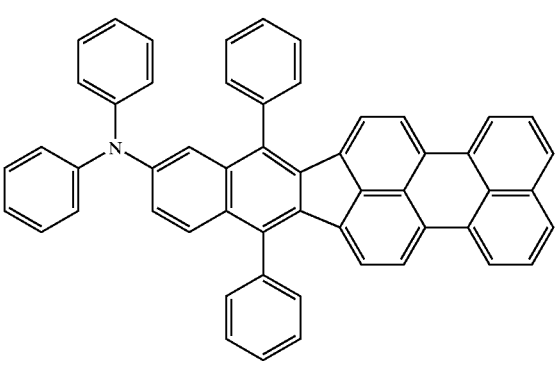
Inv-19
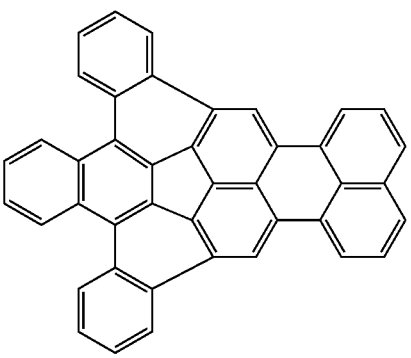
Inv-20
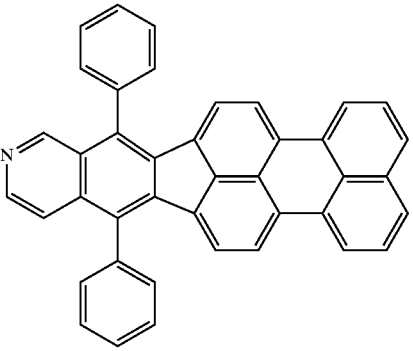

Inv-21
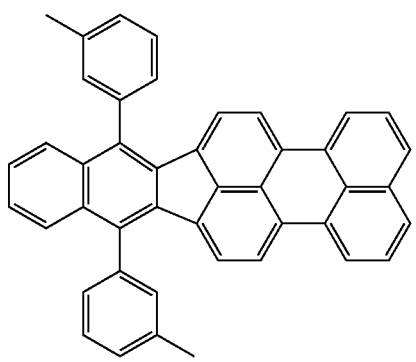

Inv-22
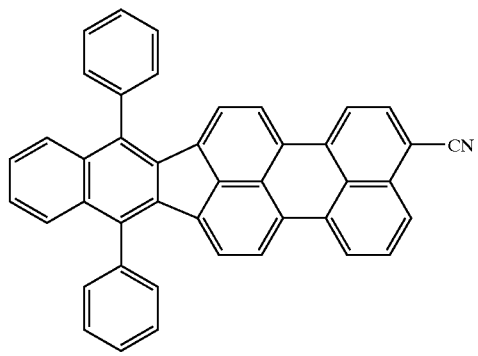

Inv-23
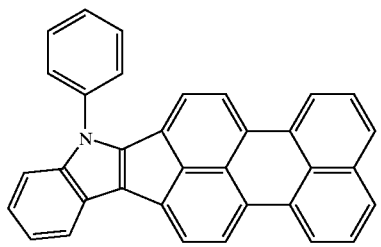

Inv-24
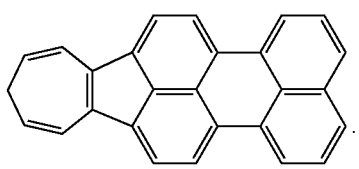

28. The device of claim 1 wherein the indenoperylene compound is represented by one of the following formulas.

Inv-1
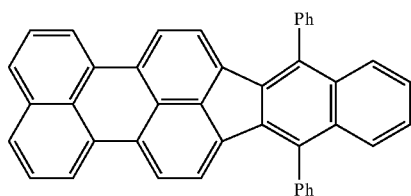

Inv-8
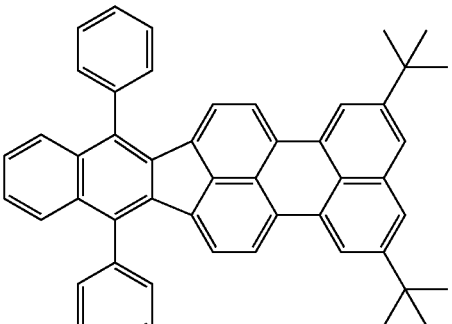

Inv-5
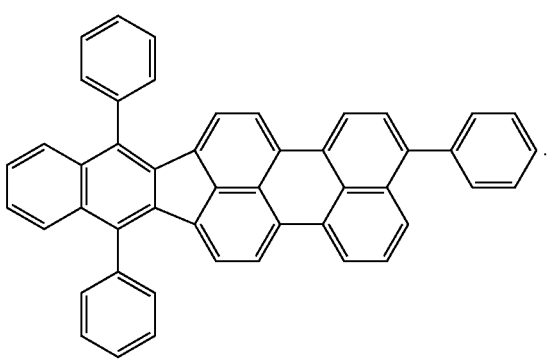

29. An OLED device comprising an anode, a hole transporting layer (HTL), a green light emitting layer (LEL), an electron transporting layer (ETL) and a cathode wherein the light emitting layer comprises a host wherein the host (Alq$_3$) has the formula:

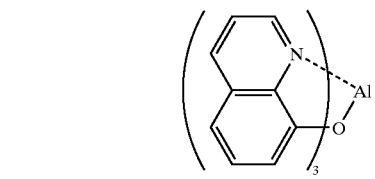

and up to 10 wt % of a green light emitting indeno[1,2,3-cd]perylene dopant compound represented by Formula (1):

(1)

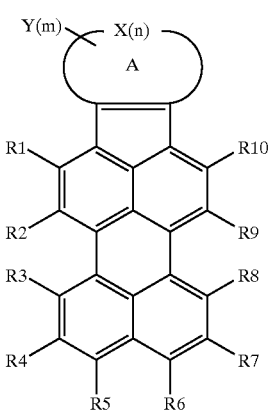

wherein:

A represents an independent ring system in which X represents a chain of a combined total of "n" carbon or heteroatoms which serve to complete a 5, 6 or 7 membered ring;

each Y is an independently selected substituent, two of which may join to form a fused ring to A;

m is 0 to 5; and

R1, R2, R3, R4, R5, R6, R7, R8, R9, and R10 are independently selected as hydrogen or substituents;

provided that any of the indicated substituents R1–R10 do not join to form further fused rings.

30. An OLED device comprising an anode, a hole transporting layer (HTL), a green light emitting layer (LEL), an electron transporting layer (ETL) and a cathode wherein the light emitting layer comprises a host wherein the host (Alq$_3$) has the formula:

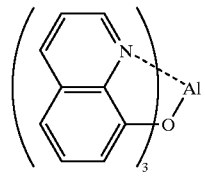

and up to 10 wt % of a green light emitting indeno[1,2,3-cd]perylene dopant compound represented by Formula (1):

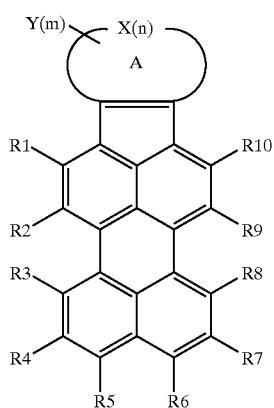

wherein:

A represents an independent ring system in which X represents a chain of a combined total of "n" carbon or heteroatoms which serve to complete a 5, 6 or 7 membered ring;

each Y is an independently selected substituent, two of which may join to form a fused ring to A;

m is 0 to 5; and

R1, R2, R3, R4, R5, R6, R7, R8, R9, and R10 are independently selected as hydrogen or substituents;

provided that any of the indicated substituents may join to form further fused rings; and provided that at least one of R1, R2, R3, R4, R5, R6, R7, R8, R9, and R10 are independently selected from the group consisting of halide, alkyl, aryl, alkoxy and aryloxy groups.

31. An OLED device comprising an anode, a hole transporting layer (HTL), a green light emitting layer (LEL), an electron transporting layer (ETL) and a cathode wherein the light emitting layer comprises a host wherein the host (Alq$_3$) has the formula:

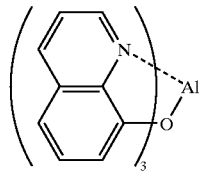

and up to 10 wt % of a green light emitting indeno[1,2,3cd]perylene dopant compound represented by Formula (1):

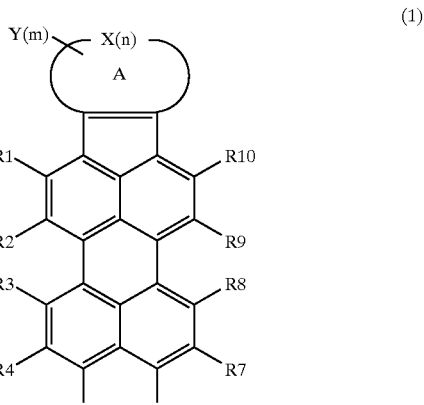

wherein:

A represents an independent ring system in which X represents a chain of a combined total of "n" carbon or heteroatoms which serve to complete a 5, 6 or 7 membered ring;

each Y is an independently selected substituent, two of which may join to form a fused ring to A;

m is 0 to 5; and

R1, R2, R3, R4, R5, R6, R7, R8, R9, and R10 are independently selected as hydrogen or substituents;

provided that any of the indicated substituents may join to form further fused rings;

and provided that the emissive dopant luminesces with a $\lambda_{max}$ in the region of 490–600 nm.

* * * * *